United States Patent
Ishikawa et al.

(10) Patent No.: US 8,692,566 B2
(45) Date of Patent: Apr. 8, 2014

(54) TEST APPARATUS AND TEST METHOD

(75) Inventors: Shinichi Ishikawa, Saitama (JP);
Masaru Goishi, Saitama (JP); Hiroyasu Nakayama, Saitama (JP); Masaru Tsuto, Saitama (JP)

(73) Assignee: Advantest Corporation, Tokyo (JP)

(*) Notice: Subject to any disclaimer, the term of this patent is extended or adjusted under 35 U.S.C. 154(b) by 251 days.

(21) Appl. No.: 13/118,585

(22) Filed: May 31, 2011

(65) Prior Publication Data

US 2012/0133380 A1    May 31, 2012

Related U.S. Application Data (63) Continuation of application No. PCT/JP2009/002401, filed on May 29, 2009, and a continuation-in-part of application No. 12/329,635, filed on Dec. 8, 2008, now Pat. No. 8,059,547.

(51) Int. Cl.
    *G01R 31/00*    (2006.01)

(52) U.S. Cl.
    USPC ..................... 324/750.01; 324/537

(58) Field of Classification Search
    USPC .................................... 324/750.01
    See application file for complete search history.

(56) References Cited

U.S. PATENT DOCUMENTS

| | | | |
|---|---|---|---|
| 4,536,126 A * | 8/1985 | Reuther ...................... | 290/40 R |
| 5,926,030 A | 7/1999 | Ito | |
| 6,067,651 A | 5/2000 | Rohrbaugh et al. | |
| 7,906,981 B1 * | 3/2011 | Iwamoto et al. ......... | 324/762.01 |
| 8,261,119 B2 * | 9/2012 | Iwamoto ...................... | 713/400 |

FOREIGN PATENT DOCUMENTS

| | | |
|---|---|---|
| JP | H08-335610 A | 12/1996 |
| JP | H9-264933 A | 10/1997 |
| JP | H10-332795 A | 12/1998 |
| JP | H11-344528 A | 12/1999 |
| JP | 2001-134469 A | 5/2001 |
| JP | 2001-211078 A | 8/2001 |
| JP | 2002-50196 A | 2/2002 |
| JP | 2007-52028 A | 3/2007 |
| JP | 2007-57541 A | 3/2007 |
| JP | 2007-096903 A | 4/2007 |
| JP | 2007-250124 A | 9/2007 |
| TW | 1266070 B | 11/2006 |
| TW | I266070 B | 11/2006 |
| WO | 2003-062843 A1 | 7/2003 |

OTHER PUBLICATIONS

JP2007-57541 Machine Translation supplied by JPO, p. 1-35.*
JP2007-250124 Machine Translation supplied by JPO, p. 1-17.*

(Continued)

*Primary Examiner* — Thomas F Valone (57) ABSTRACT

Provided is a test apparatus comprising a plurality of testing sections and a synchronizing section that synchronizes operation of at least two testing sections among the plurality of testing sections. Each testing section transmits a synchronization standby command to the synchronizing section when a predetermined condition is fulfilled during execution of the corresponding program and the testing section enters a synchronization standby state, and on a condition that the synchronization standby commands have been received from all of one or more predetermined testing sections among the plurality of testing sections, the synchronizing section supplies a synchronization signal, which ends the synchronization standby state, in synchronization to two or more predetermined testing sections among the plurality of testing sections.

16 Claims, 8 Drawing Sheets

(56) References Cited

OTHER PUBLICATIONS

International Search Report (ISR) for International application No. PCT/JP2009/002401 mailed on Aug. 25, 2009.
English translation of Written Opinion (IB338) for International application No. PCT/JP2009/002401 mailed on Jul. 14, . 2011.
The New ATE: Protocol Aware, by Andrew C. Evans, Paper 20.1 IEEE 2007.
Office Action of Mar. 16, 2010 issued for counterpart Japanese Application 2010-504107 and machine translation thereof.
Preliminary Notice of First Office Action and Search Report issued by the Taiwan Intellectual Property Office.
Preliminary Notice of First Office Action, dated Feb. 23, 2013 issued by the Taiwan Intellectual Property Office.
Preliminary Notice of First Office Action, dated Mar. 12, 2013 issued by the Taiwan Intellectual Property Office.
Preliminary Notice of First Office Action and Search Report issued by the Taiwan Intellectual Property Office Mar. 27, 2013.
Preliminary Notice of First Office Action for Taiwanese Patent Application No. 098141937, issued by the Taiwanese Patent Office on Dec. 11, 2013.

* cited by examiner

TEST APPARATUS AND TEST METHOD

BACKGROUND

1. Technical Field

The present invention relates to a test apparatus and a test method.

2. Related Art

A known test apparatus for testing a device under test such as a semiconductor chip includes a plurality of test circuits, as shown in Patent Documents 1 and 2, for example. In this case, the test circuits preferably operate in synchronization.

Patent Document 1: International Publication WO 2003/062843

Patent Document 2: Japanese Patent Application Publication No. 2007-52028

Usually, each test circuit operates according to a program or sequence provided thereto in advance. In a conventional test apparatus, the test circuits are made to operate in synchronization by beginning the execution of the programs or the like in synchronization.

However, when a large number of tests are performed, causing the execution start timings of the programs to be synchronized in the test circuits may be insufficient to achieve synchronous operation. For example, during execution of a program, there may be cases where a subsequent step is preferably executed in synchronization on a condition that all of a set of predetermined test circuits are in a standby state.

In this case, if each program is designed such that the execution time of the program to be executed until the standby state is reached is the same in each test circuit, subsequent testing can be executed in synchronization by synchronizing the timing at which execution of the program begins. However, designing such programs requires significant effort.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a test apparatus that tests a device under test, comprising a plurality of testing sections that test the device under test by operating according to programs supplied respectively thereto; and a synchronizing section that synchronizes operation of at least two testing sections among the plurality of testing sections. Each testing section transmits a synchronization standby command to the synchronizing section when a predetermined condition is fulfilled during execution of the corresponding program and the testing section enters a synchronization standby state, and on a condition that the synchronization standby commands have been received from all of one or more predetermined testing sections among the plurality of testing sections, the synchronizing section supplies a synchronization signal, which ends the synchronization standby state, in synchronization to two or more predetermined testing sections among the plurality of testing sections. Also provided is a test method using the test apparatus.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
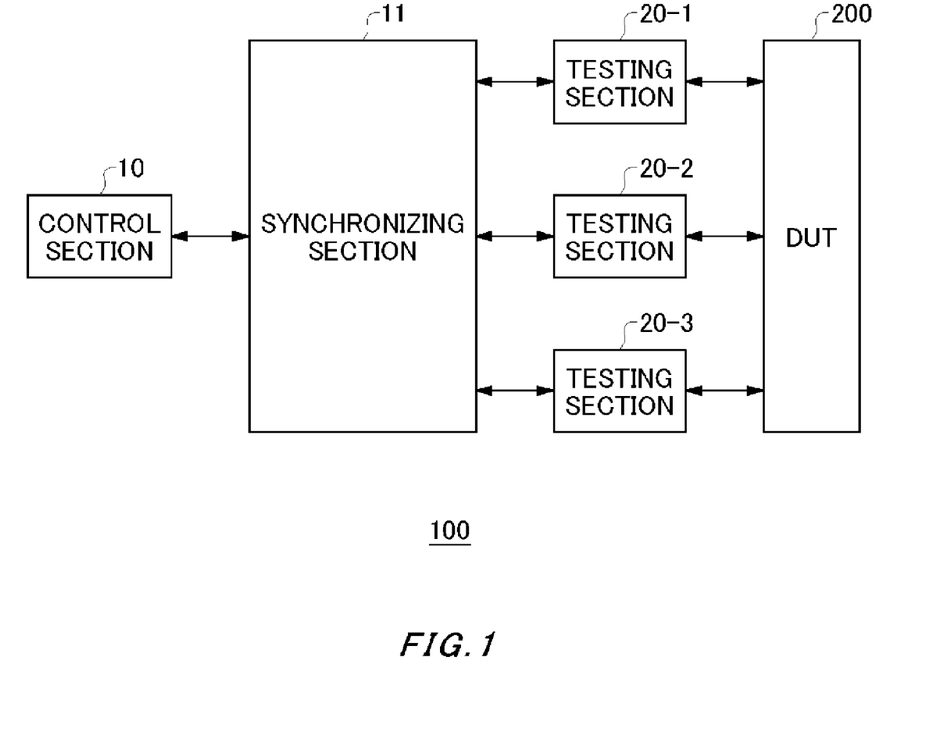
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 200, such as a semiconductor circuit, and includes a control section 10, a synchronizing section 11, and a plurality of testing sections 20. The test apparatus 100 of the present embodiment tests the device under test 200 by causing the testing sections 20 to operate in synchronization at a desired timing.

The test apparatus 100 may test a plurality of devices under test 200 in parallel. The test apparatus 100 may cause the testing sections 20 to operate in synchronization for each device under test 200, or may cause the testing sections 20 to operate in synchronization for each function block in a device under test 200. The testing sections 20 may operate in synchronization amongst a plurality of the devices under test 200, or may operate in synchronization amongst a plurality of function blocks of devices under test 200. The test apparatus 100 may cause all of the testing sections 20 to operate in synchronization. Instead, the testing sections 20 that are to operate in synchronization may be designated by a program provided by a user, for example.

The control section 10 controls the overall test apparatus 100. For example, the control section 10 may control the synchronizing section 11 and the testing sections 20 according to instructions or programs provided by the user. More specifically, the control section 10 may generate a reference clock that defines the operational period of the synchronizing section 11 and the testing sections 20, or generate control commands for controlling the operation of the synchronizing section 11 and the testing sections 20. The control section 10 may store in advance prescribed test programs or data patterns in each testing section 20. The control section 10 may exchange data with each testing section 20 via the synchronizing section 11.

Each testing section 20 tests the device under test 200 by operating according to a test program supplied thereto. For example, each testing section 20 may operate according to commands by sequentially executing the commands included in the test program provided thereto. The test program may include a sequence indicating an order in which to output a plurality of data patterns provided in advance. The testing section 20 may include a sequencer that outputs the data patterns in order according to this sequence.

Each data pattern may be a single-bit-unit pattern in which each single bit designates a logic value to be provided to a pin of the device under test 200, or may be a multi-bit-unit pattern in which each set of a plurality of bits designates a logic value to be provided to a pin of the device under test 200. The data pattern may be a packet-unit pattern in which the logic value to be provided to a terminal of the device under test 200 is designated over a plurality of bits for realizing a prescribed test function. Packets corresponding to test functions of the test apparatus 100 are described in detail further below.

Each testing section 20 may judge pass/fail of the device under test 200 by comparing a signal received from the device under test 200 to an expected value. Each testing section 20 generates the expected value using the same process that is used to generate the patterns to be supplied to the device under test 200.

The synchronizing section 11 causes at least two of the testing sections 20 to operate in synchronization. As described above, the synchronizing section 11 can cause a variety of combinations of the testing sections 20 to operate in synchronization. The combinations of the testing sections 20 may be designated by the control section 10, or may be designated according to a test program supplied from the control section 10.

Figure 2:
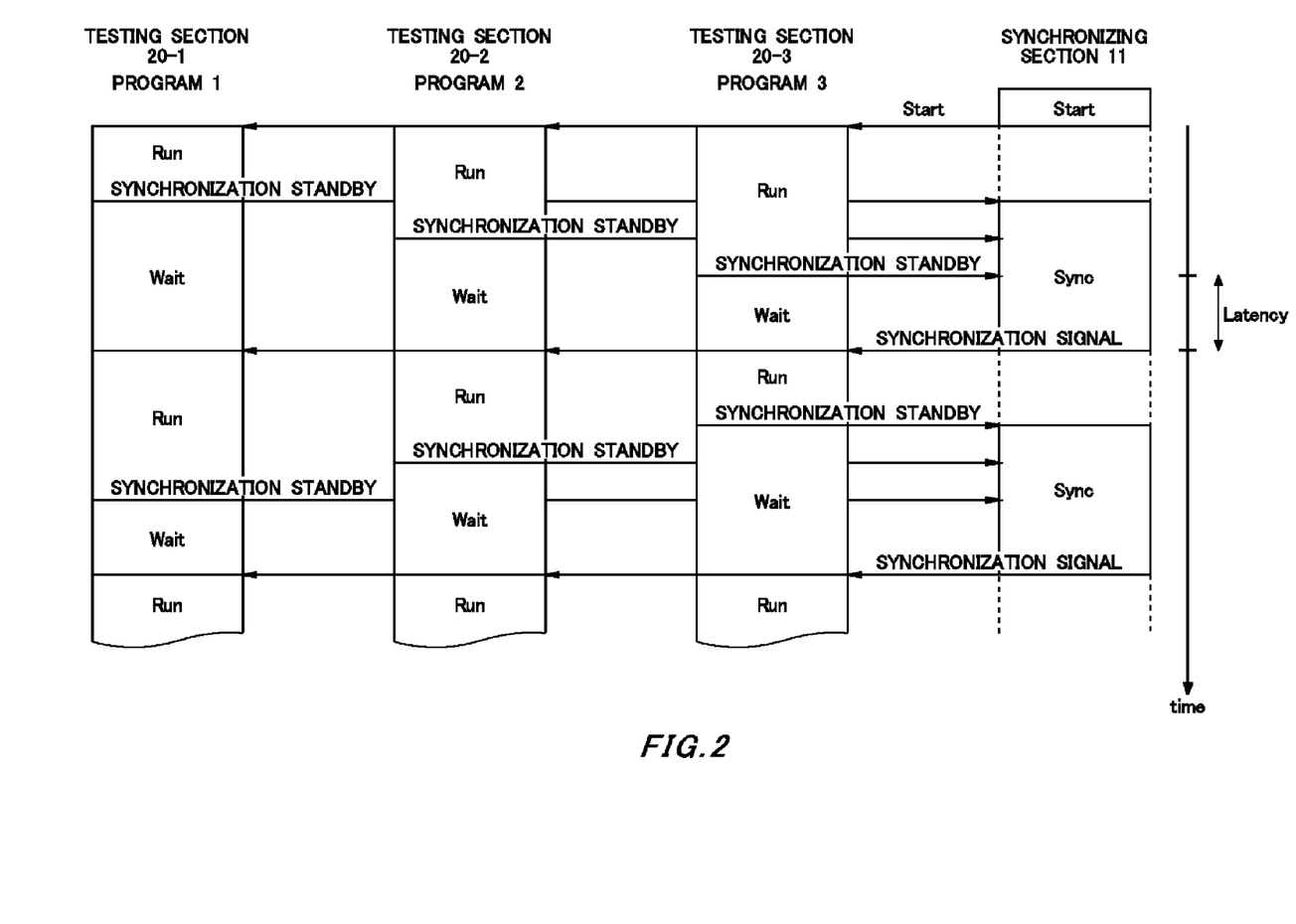
FIG. 2 is a timing chart of an exemplary operation of the test apparatus 100.

FIG. 2 is a timing chart of an exemplary operation of the test apparatus 100. In this example, three testing sections 20 operate in synchronization, but the test apparatus 100 may cause a different number of testing sections 20 to operate in synchronization. The control section 10 stores test programs and data patterns in the testing sections 20 in advance.

The synchronizing section 11 supplies each testing section 20 in synchronization with a start signal (Start) that causes execution of the test program to begin. Each testing section 20 begins executing the test program (Run) in response to the start signal. Each test program may include a plurality of test blocks.

When predetermined conditions are fulfilled during the execution of the test program, each testing section 20 moves on to a synchronization standby state (Wait). For example, each testing section 20 may move to the synchronization standby state (Wait) when the execution of a test block is finished. The execution of each test block may be finished when the results obtained from the device under test 200 fulfill predetermined conditions. In this way, when the synchronization standby state (Wait) is reached during execution of a test program, the corresponding testing section 20 notifies the synchronizing section 11 with a synchronization standby command. Each testing section 20 preferably moves to the synchronization standby state (Wait) after notifying the synchronizing section 11 with the synchronization standby command. Furthermore, when the synchronization standby state is ended, each testing section 20 begins executing the next text block (Run).

The synchronizing section 11 detects whether the synchronization standby command is received from all of one or more predetermined testing sections 20 among the plurality of testing sections 20. Here, the synchronizing section 11 is notified about which testing sections 20 are designated as the one or more predetermined testing sections 20. For example, a test block executed by a testing section 20 may include a command for notifying the synchronizing section 11 concerning the one or more testing sections 20. In the present example, the "one or more testing sections 20" refers to all of the three testing sections 20.

On a condition that synchronization standby commands are received from all of the testing sections 20, the synchronizing section 11 supplies two or more predetermined testing sections 20 in synchronization with a synchronization signal that ends the synchronization standby state. The synchronizing section 11 may be notified in advance concerning which testing sections 20 are the predetermined two or more testing sections 20. For example, a test block executed by a testing section 20 may include a command for notifying the synchronizing section 11 concerning the two or more testing sections 20. In the present example, the "two or more testing sections 20" refers to all of the three testing sections 20.

As described above, on a condition that the synchronization standby command is received from all of the testing sections 20, the synchronizing section 11 of the present example supplies the synchronization signal in synchronization to all of the testing sections 20. At this time, the synchronizing section 11 supplies the synchronization signal in synchronization to the three testing sections 20 after a predetermined time period (Latency) has passed since the last synchronization standby command notification was received. This time period (Latency) is preferably a constant time that is not affected by the number of testing sections 20 sending the synchronization standby command to the synchronizing section 11. Each testing section 20 that receives the synchronization signal begins execution of the next test block in synchronization.

By repeating the control described above, each testing section 20 can synchronously begin executing the test blocks. The content and execution time of each test block to be executed in synchronization by the testing sections 20 may be different. For example, each of the test blocks to be executed in synchronization by the testing sections 20 may include a command group with a different configuration, or may include a command group with a plurality of different commands. The test apparatus 100 of the present embodiment can cause each testing section 20 to operate in synchronization during test program execution, and can therefore easily cause the testing sections 20 to operate in synchronization for each test block, even when each testing section 20 executes a test block with different execution time.

Figure 3:
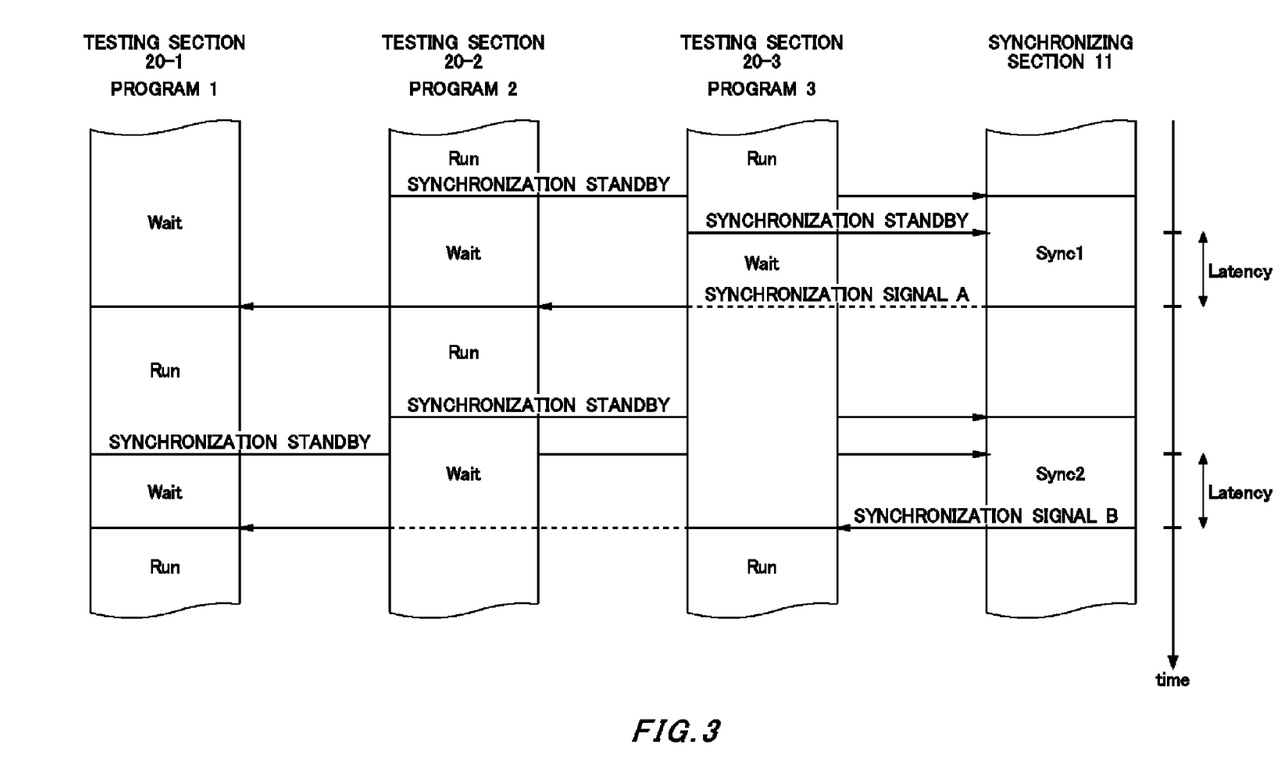
FIG. 3 is a timing chart of another exemplary operation of the test apparatus 100.

FIG. 3 is a timing chart of another exemplary operation of the test apparatus 100. The test apparatus 100 in this example supplies the synchronization signal in synchronization to two predetermined testing sections 20 among the three testing sections 20, on a condition that the synchronization standby commands are received from the two predetermined testing sections 20. The combination of the testing sections 20 that send the synchronization standby commands to the synchronizing section 11 may be different from the combination of testing sections 20 that receive the synchronization signal from the synchronizing section 11.

As shown in FIG. 3, on a condition that the synchronization standby commands are received from the second testing section 20-2 and the third testing section 20-3, the synchronizing section 11 may supply the synchronization signal to the first testing section 20-1 and the second testing section 20-2. In this case, on a condition that the second testing section 20-2 and the third testing section 20-3 have moved to the synchronization standby state (Wait), the first testing section 20-1 and the second testing section 20-2 begin executing the next test block (Run).

During execution of the test program, the synchronizing section 11 may change at least one of the combination of testing sections 20 that transmit the synchronization standby commands to the synchronizing section 11 and the combination of the testing sections 20 that receive the synchronization signal from the synchronizing section 11. For example, as described above, when a synchronization signal A is supplied, the synchronizing section 11 may supply the synchronization signal to the first testing section 20-1 and the second testing section 20-2 on a condition that the synchronization standby commands are received from both the second testing section 20-2 and the third testing section 20-3.

As shown in FIG. 3, when a synchronization signal B is supplied after the synchronization signal A, the synchronizing section 11 may supply the synchronization signal to the first testing section 20-1 and the third testing section 20-3 on a condition that the synchronization standby commands are received from both the first testing section 20-1 and the second testing section 20-2. In this way, a variety of tests can be performed by changing the combination of the testing sections 20 serving as synchronized operation triggers and the combination of testing sections 20 performing the synchronized operation.

Each testing section 20 may notify the synchronizing section 11 in advance concerning the synchronization signal, for each combination of testing sections 20 transmitting the synchronization standby commands to the synchronizing section 11 and each combination of testing sections 20 receiving the synchronization signal from the synchronizing section 11. For example, when a testing section 20 enters the synchronization standby state prior to other testing sections 20 transmitting the synchronization standby command to the synchronizing section 11, this testing section 20 transmits to the synchronizing section 11 a designation command indicating whether the synchronization standby state of this testing section 20 is to be ended. The testing section 20 may transmit this designation command in advance for each synchronization standby state.

The synchronizing section 11 determines the combination of the testing sections 20 that transmit the synchronization standby commands to the synchronizing section 11 and the combination of the testing sections 20 that receive the synchronization signal from the synchronizing section 11 for the next synchronization signal to be generated, based on the designation commands received each time a testing section 20 enters the synchronization standby state. For example, with the synchronization signal B described above, the first testing section 20-1 and the third testing section 20-3 transmit in advance, to the synchronizing section 11, designation commands for ending their own synchronization standby states when the first testing section 20-1 and the second testing section 20-2 are in the synchronization standby state. On a condition that the synchronization standby commands have been received from the combination of the first testing section 20-1 and the second testing section 20-2, the synchronizing section 11 determines that the synchronization signal is to be sent to the combination of the first testing section 20-1 and the third testing section 20-3, based on these designation commands.

With the above configuration, the synchronizing section 11 can determine a combination of testing sections 20 to transmit the synchronization standby commands to the synchronizing section 11 and a combination of testing sections 20 to receive the synchronization signal from the synchronizing section 11, each time the testing sections 20 enter the synchronization standby state. Accordingly, the test block execution can be synchronized using various combinations of testing sections 20.

Figure 4:
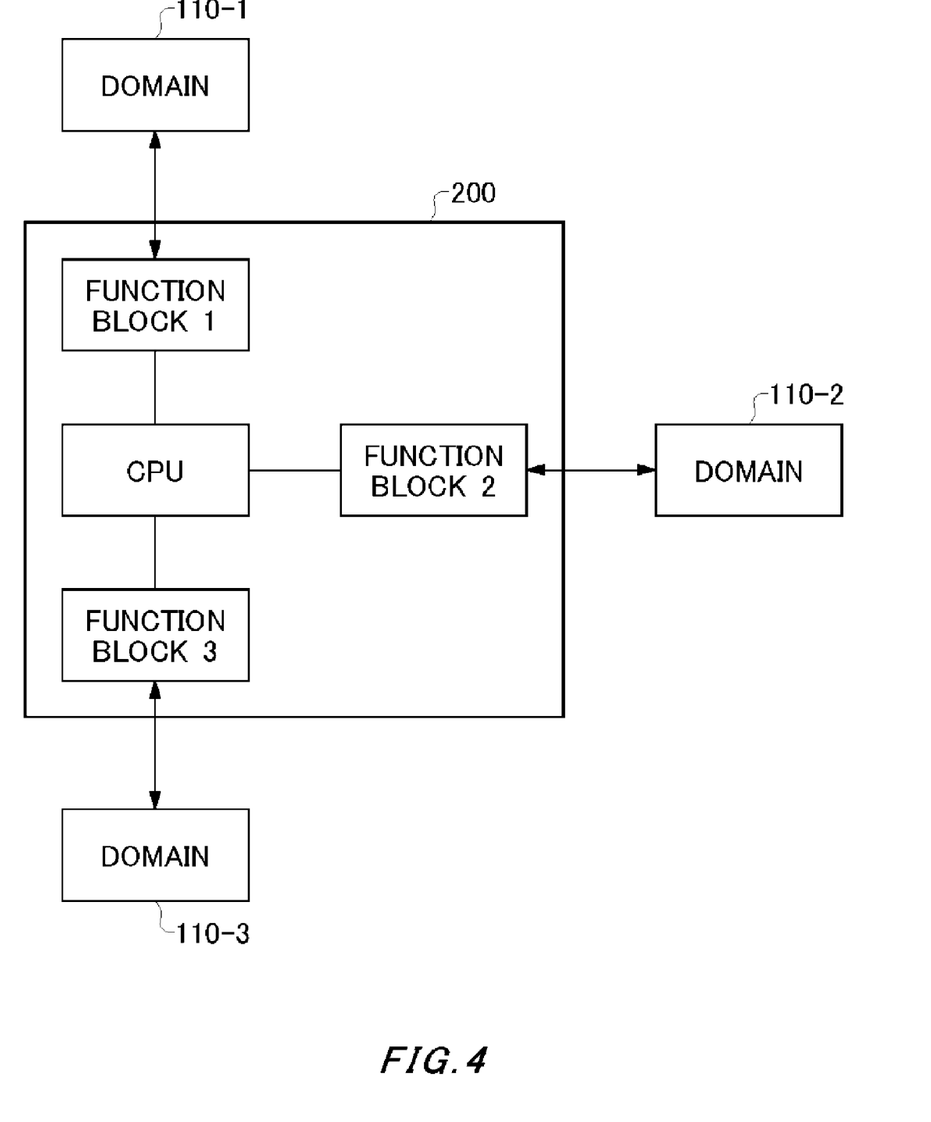
FIG. 4 shows an exemplary configuration of the device under test 200.

FIG. 4 shows an exemplary configuration of the device under test 200. The device under test 200 of the present example includes a plurality of function blocks. Each function block operates at a different frequency. In this case, the test apparatus 100 may include a time domain 110 for each function block. Each time domain 110 may include the synchronizing section 11 and a plurality of the testing sections 20 described in relation to FIG. 1. In this case, the test apparatus 100 may cause the testing sections 20 to operate in synchronization, as described in relation to FIGS. 2 and 3, for each time domain 110.

The test apparatus 100 may further cause the testing sections 20 to operate in synchronization among a plurality of time domains 110. In this case, the synchronizing section 11 has a function to synchronize the testing sections 20 according to each time domain 110 independently and a function to synchronize the testing sections 20 according to a plurality of the time domains 110. The function for synchronizing the testing sections 20 according to each time domain independently may be the same as the function of the synchronizing section 11 described in relation to FIGS. 2 and 3.

When synchronizing the testing sections 20 amongst a plurality of time domains 110, the synchronizing section 11 may notify an upper-level synchronizing function thereof when synchronization standby commands have been received from all of the predetermined testing sections 20 in a time domain 110 for the lower-level synchronization function of each time domain 110. When this notification has been received from all of the time domains 110 to be synchronized, the upper-level synchronizing function may supply each time domain 110 with the synchronization signal. With this configuration, each time domain 110 can test, in synchronization, a device under test 200 having a plurality of function blocks with different operational frequencies.

Figure 5:
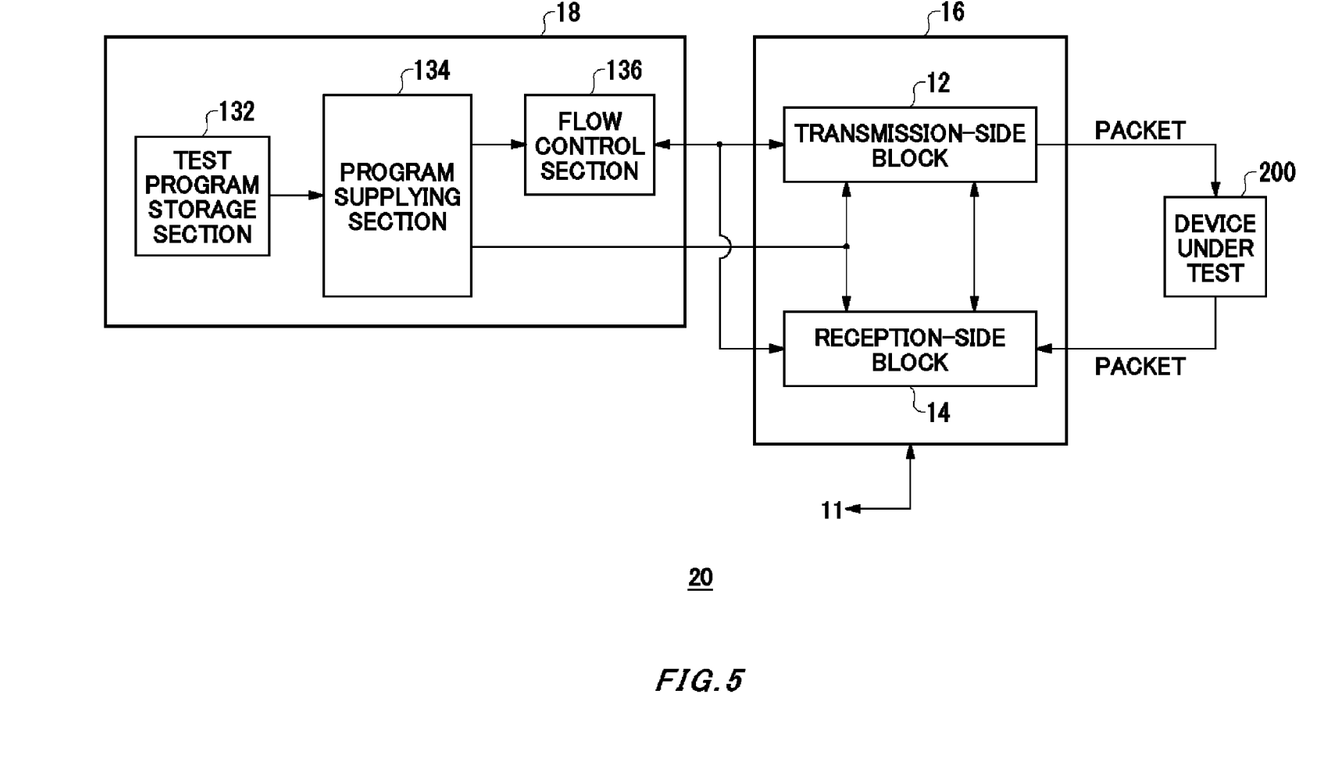
FIG. 5 shows an exemplary configuration of a testing section 20.

FIG. 5 shows an exemplary configuration of a testing section 20. The following describes an example in which the device under test 200 exchanges data with the testing section 20 in packet units that are predetermined by a prescribed test function. The testing section 20 of the present embodiment includes an execution processing section 18 and a communication processing section 16.

The execution processing section 18 includes a test program storage section 132, a program supplying section 134, and a flow control section 136. Each communication processing section 16 includes a transmission-side block 12 and a reception-side block 14.

The test program storage section 132 stores test programs supplied from the control section 10. The program supplying section 134 generates, from a test program stored in the test program storage section 132, a plurality of packet lists each including a series of packets transmitted by the corresponding communication processing section 16, and stores the packet lists in packet list storage sections 60 provided in the transmission-side block 12 and the reception-side block 14 (see FIGS. 6 and 7).

Each packet list may indicate the order in which to execute identification information of a plurality of packets to be generated for executing the prescribed test function. For example, a packet list may designate the order of set-up packets, transmission packets, and ACK packets, for example. The program supplying section 134 may generate a packet list corresponding to each test function to be performed by the test program, and store the packet lists in the packet list storage sections 60. The program supplying section 134 also generates a control program in which is recorded the order in which the packet lists stored in the packet list storage sections 60 are to be executed, and supplies this control program to the flow control section 136.

The flow control section 136 designates, for the corresponding communication processing section 16, the order in which the packet lists are to be executed, according to the control program. More specifically, the flow control section 136 executes the control program supplied from the program supplying section 134 and specifies, for the communication processing section 16, the next packet list to be executed from among the packet lists stored in the packet list storage section 60.

For example, the flow control section 136 may transmit to the communication processing section 16 an address of the next packet list to be executed. If the control program includes computations such as conditional branching, unconditional branching, or subroutine acquisition, the flow control section 136 specifies the next packet list to be executed according to the content of packets received by the testing section 20 from the device under test 200. The transmission-side block 12 and the reception-side block 14 test the corresponding device under test 200 by sequentially transmitting to the corresponding device under test 200 the series of packets included in the packet lists sequentially designated by the flow control section 136.

The transmission-side block 12 supplies the device under test 200 with a read packet that designates an address and causes the device under test 200 to read data from the designated address, a write packet that designates an address and causes the device under test 200 to write prescribed data to the designated address, and a wait packet that causes the device under test 200 to enter the standby state, for example. The device under test 200 operates according to the packets received from the testing section 20, and transmits the operational results to the reception-side block 14.

The reception-side block 14 judges pass/fail of the operation of the device under test 200 based on reception packets received from the device under test 200. For example, the reception-side block 14 may generate an expected value pattern corresponding to pattern data included in transmission packets transmitted by the transmission-side block 12, and compare this expected value pattern to the reception packets.

During execution of the test program, each testing section 20 transmits a synchronization standby command to the synchronizing section 11 when a command is detected to enter the standby state. This command may cause a predetermined wait packet to be repeatedly sent to the device under test 200. Each testing section 20 may transmit the designation command described above prior to transmitting the synchronization standby command.

The transmission-side block 12 repeatedly transmits the prescribed wait operation packet to the device under test 200 until receiving a synchronization signal that ends the synchronization standby state. The wait packet may be a packet that does not affect the testing by other testing sections 20, such as a packet that applies a prescribed bit pattern to the device under test 200.

More specifically, the wait packet may be a pattern that repeatedly applies a logic value of 0 to a corresponding pin of the device under test 200. Each testing section 20 executes the command of the next test block when a synchronization signal is received while the wait packet is being repeatedly transmitted.

Figure 6:
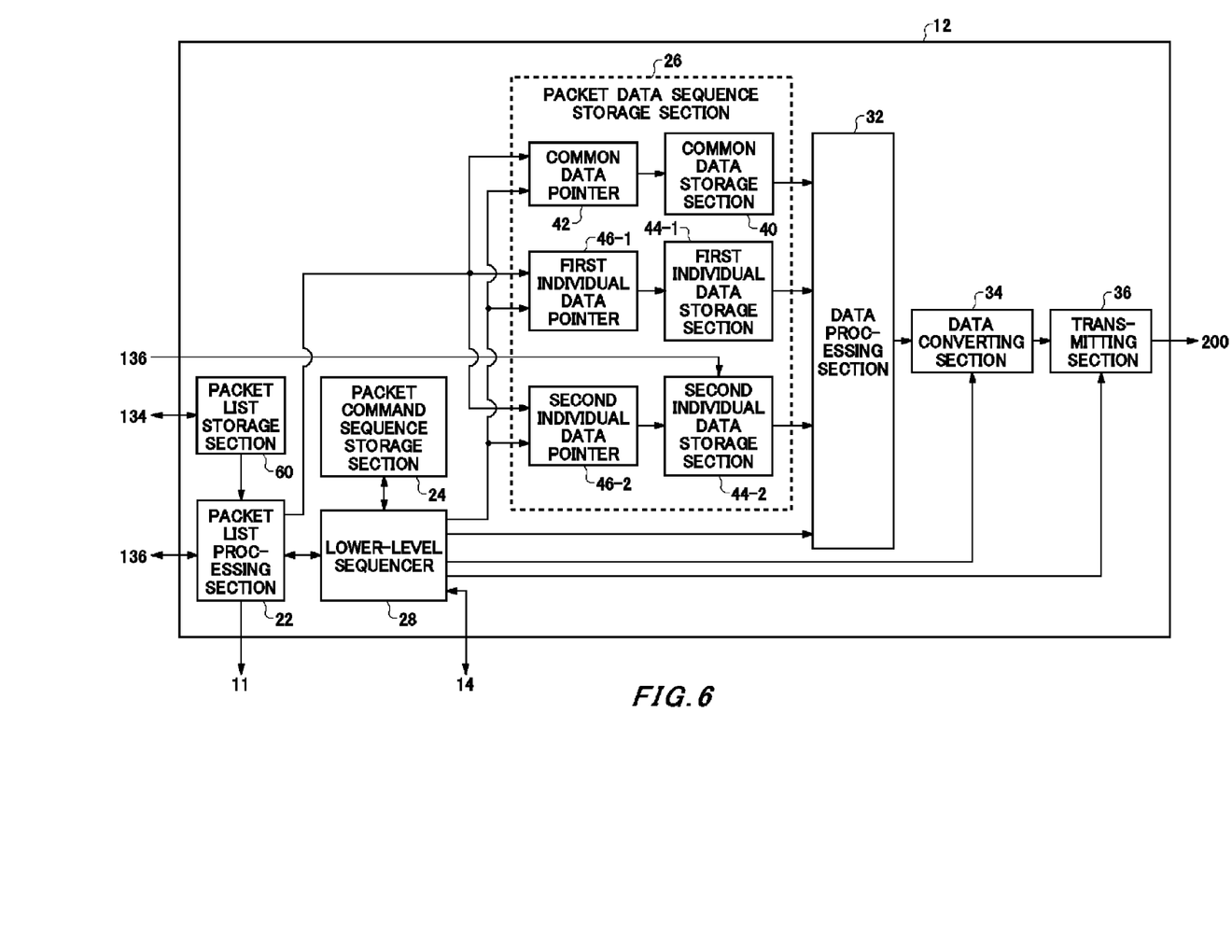
FIG. 6 shows an exemplary configuration of the transmission-side block 12.

FIG. 6 shows an exemplary configuration of the transmission-side block 12. The transmission-side block 12 includes a packet list processing section 22, a packet command sequence storage section 24, a packet data sequence storage section 26, a lower-level sequencer 28, a data processing section 32, a data converting section 34, a packet list storage section 60, and a transmitting section 36.

The packet list processing section 22 executes the packet list designated by the flow control section 136, from among the packet lists stored in the packet list storage section 60, and sequentially designates the packets to be transmitted to the device under test 200. For example, the packet list processing section 22 may execute the packet lists from an address received from the flow control section 136, to sequentially designate the packets to be transmitted to the device under test 200.

The packet list processing section 22 may designate an address in the packet command sequence storage section 24 at which is stored a command sequence for generating the designated packet, for example. Furthermore, the packet list processing section 22 may designate an address of a data sequence, e.g. a leading address of a data sequence, included in the packet in the packet data sequence storage section 26 to be transmitted to the device under test 200.

In this way, the packet list processing section 22 individually designates an address of a command sequence for generating a packet and an addresses of a data sequence included in the packet. In this case, if a command sequence or data sequence is designated that is common to two or more packets in the packet list, the packet list processing section 22 may designate the same command sequence address or the same data sequence address for the two or more packets.

If the designated packet is a wait packet, the packet list processing section 22 may transmit a synchronization standby command (and a designation command) to the synchronizing section 11. The packet list processing section 22 may determine whether the packet is a wait packet based on the identification information or the address of the designated packet, for example.

Instead of the packet list processing section 22, the flow control section 136 may transmit the synchronization standby command. If a wait packet is included in the designated packet list, the flow control section 136 may transmit a synchronization standby command (and a designation command) to the synchronizing section 11.

The packet command sequence storage section 24 stores, for each type of packet, a command sequence for generating a corresponding type of packets. For example, the packet command sequence storage section 24 may store a command sequence for generating write packets, a command sequence for generating read packets, and a command sequence for generating wait packets.

The packet data sequence storage section 26 stores, for each type of packet, a data sequence included in a corresponding type of packet. For example, the packet data sequence storage section 26 may store a data sequence included in a write packet, a data sequence included in a read packet, and a data sequence included in a wait packet.

The packet data sequence storage section 26 may include a common data storage section 40, a common data pointer 42, a first individual data storage section 44-1, a second individual data storage section 44-2, a first individual data pointer 46-1, and a second individual data pointer 46-2. The common data storage section 40 stores common data that is shared among the packet types, in a data sequence included in each type of packet. The common data storage section 40 may store, for each packet type, a start code indicating the start of the packet, an end code indicating the end of the packet, and a command code for identifying the type of the packet.

The common data pointer 42 acquires, from the packet list processing section 22, a leading address of a block in which is stored the common data included in the packet designated by the packet list processing section 22. Furthermore, the common data pointer 42 acquires from the lower-level sequencer 28 an offset position within the block. The common data pointer 42 provides the common data storage section 40 with the address determined based on the leading address and the offset position, e.g. an address that is the sum of the leading address and the offset position, and supplies the data processing section 32 with the common data stored at this address.

The first and second individual data storage sections 44-1 and 44-2 store individual data that changes for each packet, in the data sequence included in each packet type. The first and second individual data storage sections 44-1 and 44-2 may store actual data transmitted to the device under test 200 or actual data received from the device under test 200, which is included in each packet.

The first individual data storage section 44-1 stores predetermined individual data that is not affected by the packet list being executed. The second individual data storage section 44-2 stores individual data that is changed for each packet list executed. For example, the second individual data storage section 44-2 receives individual data from the flow control section 136 in the execution processing section 18, either before testing or during testing as desired.

The first and second individual data pointers 46-1 and 46-2 receive from the packet list processing section 22 the leading address of the block in which is stored the individual data included in the packet designated by the packet list processing section 22. Furthermore, the first and second individual data pointers 46-1 and 46-2 acquire from the lower-level sequencer 28 the offset position in this block.

The first and second individual data pointers 46-1 and 46-2 supply the first and second individual data storage sections 44-1 and 44-2 with the address determined based on the leading address and the offset position, e.g. an address that is the sum of the leading address and the offset position. The first and second individual data pointers 46-1 and 46-2 supply the data processing section 32 with the individual data stored at this address in the first and second individual data storage sections 44-1 and 44-2.

The lower-level sequencer 28 reads from the packet command sequence storage section 24 the command sequence of the packet designated by the packet list processing section 22, i.e. the command sequence at the address designated by the packet list processing section 22, and sequentially executes the commands included in the read command sequence. Furthermore, the lower-level sequencer 28 causes the packet data sequence storage section 26 to sequentially output the data sequence of the packet designated by the packet list processing section 22, i.e. the data sequence at the address designated by the packet list processing section 22, according to the command sequence execution, thereby generating the test data sequence used to test the device under test 200.

The lower-level sequencer 28 may supply the common data pointer 42, the individual data pointer 46-1, and the individual data pointer 46-2 with the offset position indicating the position of the data corresponding to the executed command in the block storing the data sequence included in the packet designated by the packet list processing section 22, for example. In this case, the lower-level sequencer 28 may generate an expected value at the first command and generate the offset position to be a count value that is incremented each time the command being executed changes.

For each command execution, the lower-level sequencer 28 supplies the data processing section 32 and the data converting section 34 with control data instructing application of a designated process, e.g. a computation or data conversion, to the read individual data or the common data. As a result, the lower-level sequencer 28 can cause a designated data portion in the packet designated by the packet list processing section 22 to be data resulting from a designated process being applied to the read data.

For each command execution, the lower-level sequencer 28 designates which of the common data, the individual data, and the data processed by the data processing section 32 is output by the data processing section 32. Here, the individual data is the predetermined individual data that is not affected by the packet list being executed or the individual data that changes for each packet being executed. In other words, for each command execution, the lower-level sequencer 28 indicates that data is to be read and output from one of the common data storage section 40, the first individual data storage section 44-1, the second individual data storage section 44-2, and the register storing the processed data in the data processing section 32.

As a result, the lower-level sequencer 28 can generate the data portion that changes for each packet in the packet designated by the packet list processing section 22, based on the individual data read from the individual data storage section 44. Furthermore, the lower-level sequencer 28 can generate the data portion common to each packet type in the packet designated by the packet list processing section 22, based on the common data read from the common data storage section 40. Yet further, the lower-level sequencer 28 can apply the designated process to the designated data portion in the packet designated by the packet list processing section 22.

The lower-level sequencer 28 may supply the packet list processing section 22 with an end notification in response to the execution of the command sequence designated by the packet list processing section 22 ending. In this way, the packet list processing section 22 can sequentially designate packets according to the progress of the execution of the command sequence by the lower-level sequencer 28.

The lower-level sequencer 28 designates, for the transmitting section 36, an edge timing of the signal transmitted to the device under test 200. For example, the lower-level sequencer 28 may control the edge timing for each packet by supplying a timing signal to the transmitting section 36.

Figure 7:
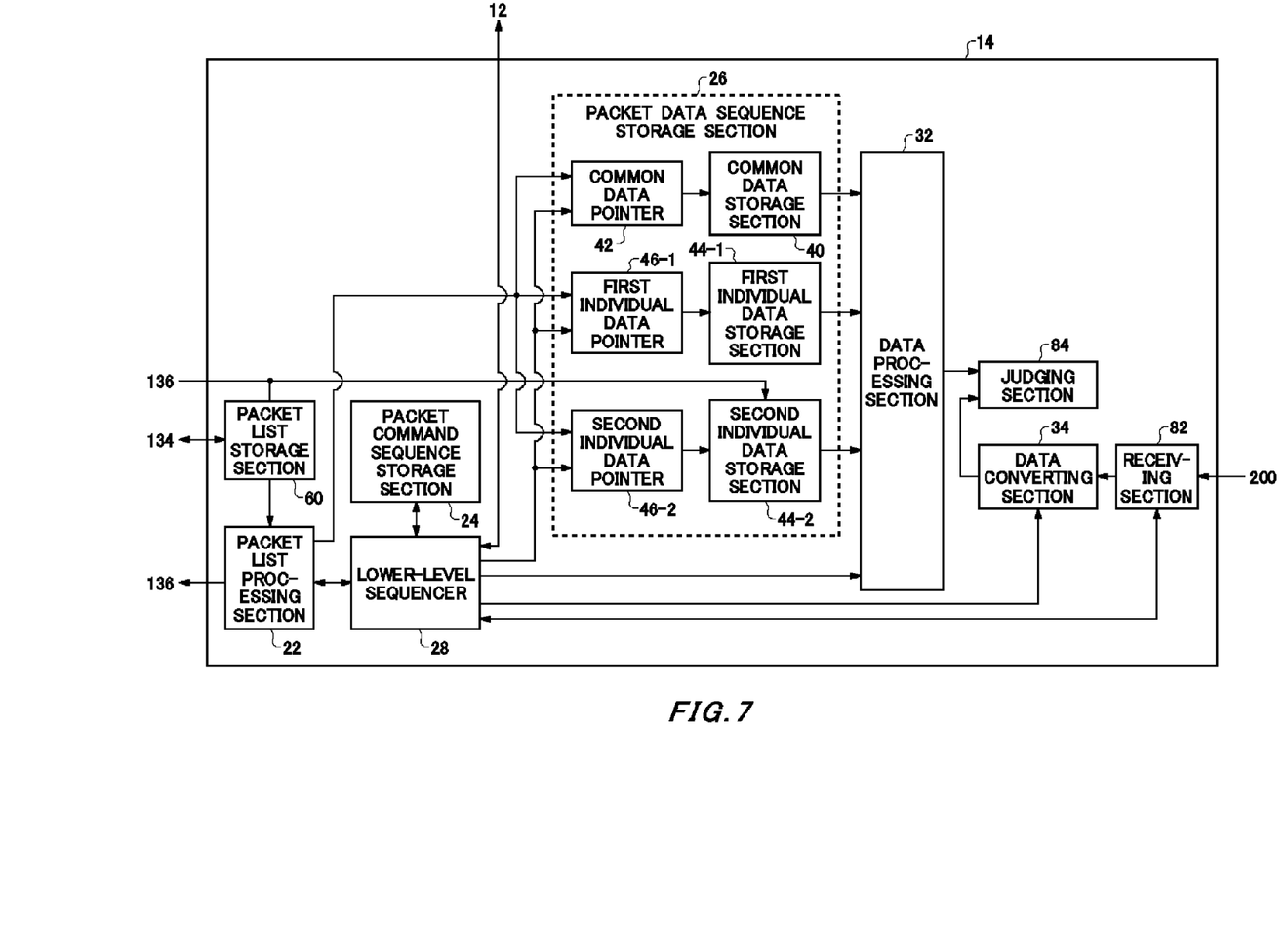
FIG. 7 shows an exemplary configuration of the reception-side block 14.

The lower-level sequencer 28 communicates with a reception-side lower-level sequencer 28 of the reception-side block 14. As a result, the transmission-side lower-level sequencer 28 of the transmission-side block 12 can execute command sequences in synchronization with the reception-side lower-level sequencer 28 of the reception-side block 14 by performing a handshake with the reception-side lower-level sequencer 28.

The transmission-side lower-level sequencer 28 may notify the reception-side lower-level sequencer 28 that a test data sequence of the predesignated packet has been transmitted to the device under test 200, for example. In this way, the transmission-side lower-level sequencer 28 can prevent pass/fail judgment of the received data until the reception-side lower-level sequencer 28 receives notification from the transmission-side lower-level sequencer 28.

The transmission-side lower-level sequencer 28 may receive notification from the reception-side lower-level sequencer 28 that a data sequence matching the generated test data sequence has been received, and generate the test sequence data of the predesignated packet, for example. In this way, the transmission-side lower-level sequencer 28 can transmit the predesignated packet to the device under test 200 after the prescribed packet is received from the device under test 200.

The data processing section 32 reads the data sequence of the packet designated by the packet list processing section 22, from the packet data sequence storage section 26, and generates the test data sequence used to test the device under test 200. The data processing section 32 may receive data from the common data storage section 40, the first individual data storage section 44-1, and the second individual data storage section 44-2, perform the process designated by the lower-level sequencer 28 on the received data, and output the result as the data of the test data sequence.

The data converting section 34 performs a data conversion on the test data sequence output from the data processing section 32, at a timing designated by the lower-level sequencer 28. For example, the data converting section 34 may perform an 8 b/10 b conversion on the test data sequence using a preset table. Furthermore, the data converting section 34 may perform a scramble process on the test data sequence, for example. The data converting section 34 then outputs the converted data sequence. The transmitting section 36 transmits to the device under test 200 the test data sequence output from the data converting section 34.

FIG. 7 shows an exemplary configuration of the reception-side block 14. The reception-side block 14 has substantially the same function and configuration as the transmission-side block 12 shown in FIG. 6. Components of the reception-side block 14 that have the same function and configuration as components of the transmission-side block 12 are given the same reference numerals, and further description is omitted.

The reception-side block 14 includes a packet list processing section 22, a packet command sequence storage section 24, a packet data sequence storage section 26, a lower-level sequencer 28, a data processing section 32, a data converting section 34, a packet list storage section 60, a receiving section 82, and a judging section 84. The receiving section 82 receives the data sequences of reception packets from the device under test 200.

In the reception-side block 14, the data converting section 34 performs data conversion on the data sequence received by the receiving section 82, at a timing designated by the lower-level sequencer 28. For example, the data converting section 34 in the reception-side block 14 may perform an 8 b/10 b conversion on the received data sequence, using a preset table. Furthermore, the data converting section 34 in the reception-side block 14 may perform a scramble process on the received data sequence, for example. The data converting section 34 in the reception-side block 14 outputs the converted data sequence.

The data converting section 34 in the reception-side block 14 supplies the judging section 84 with the converted data sequence. Furthermore, the data converting section 34 in the reception-side block 14 may store the converted data sequence at a designated address of the second individual data storage section 44-2 in the packet data sequence storage section 26.

The packet list processing section 22 in the reception-side block 14 may execute a packet list from the address received from the flow control section 136, for example. The packet list processing section 22 in the reception-side block 14 sequentially designates packets that are expected to be received from the device under test 200.

The lower-level sequencer 28 in the reception-side block 14 causes the packet data sequence storage section 26 to output the data sequence of the packet expected to be output from the device under test 200, as the test data sequence. The lower-level sequencer 28 in the reception-side block 14 designates, for the receiving section 82, a strobe timing for acquiring the data value of the signal output from the device under test 200. The data processing section 32 in the reception-side block 14 supplies the judging section 84 with the generated test data sequence.

The judging section 84 receives the test data sequence from the data processing section 32 and the data sequence from the data converting section 34. The judging section 84 judges pass/fail of the communication with the device under test 200, based on the result of a comparison between the received data sequence and the test data sequence. For example, the judging section 84 may include a logic comparing section that makes a comparison to determine whether the test data sequence and the data sequence received by the receiving section 82 match, and a fail memory that records the comparison results. The judging section 84 may notify the lower-level sequencer 28 when the data sequence received by the receiving section 82 matches the designated data sequence, for example.

The lower-level sequencer 28 in the reception-side block 14 communicates with the transmission-side lower-level sequencer 28 of the transmission-side block 12 shown in FIG. 6. As a result, the reception-side lower-level sequencer 28 of the reception-side block 14 can execute command sequences in synchronization with the transmission-side lower-level sequencer 28 of the transmission-side block 12 by performing a handshake with the transmission-side lower-level sequencer 28.

The reception-side lower-level sequencer 28 may notify the transmission-side lower-level sequencer 28 when a data sequence is received that matches the test data sequence generated by the reception-side lower-level sequencer 28. As a result, the transmission-side lower-level sequencer 28 can receive the notification from the reception-side lower-level sequencer 28 that a data sequence matching the generated test data sequence is received, and generate the test data pattern of the predesignated packet. When the packet to be generated in response to the notification received from the reception-side lower-level sequencer 28 is a wait packet for entering the synchronization standby state, the transmission-side lower-level sequencer 28 may transmit a synchronization standby command (and a designation command) to the synchronizing section 11.

The reception-side lower-level sequencer 28 may prohibit the judging section 84 from performing the pass/fail judgment of the data sequence received by the receiving section 82 until notification is received from the transmission-side lower-level sequencer 28 that the test data sequence of the predesignated packet has been transmitted to the device under test 200. As a result, the reception-side lower-level sequencer 28 can judge whether the device under test 200 has output a response to the prescribed packet after the prescribed packet has been transmitted to the device under test 200.

Figure 8:
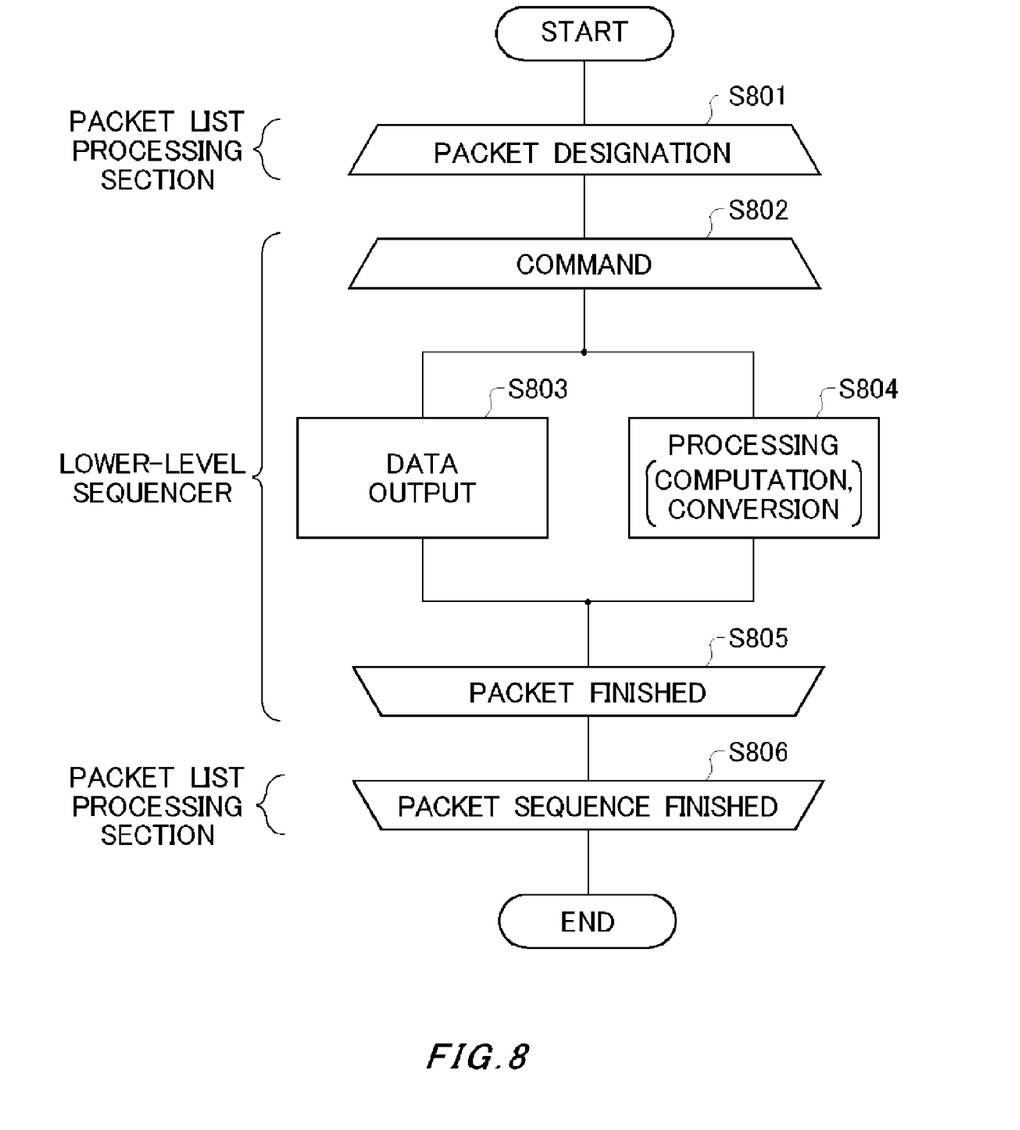
FIG. 8 shows a process flow of the testing section 20 according to the present embodiment.

FIG. 8 shows a process flow of the testing section 20 according to the present embodiment. First, the packet list processing section 22 executes a packet list and sequentially designates the packets to be transmitted to the device under test 200 (S801, S806). At this time, when a command designating a wait packet is detected, the packet list processing section 22 or the lower-level sequencer 28 may transmit a synchronization standby command (and a designation command) to the synchronizing section 11. In this case, the packet list processing section 22 repeatedly designates the wait packet until a synchronization signal is received from the synchronizing section 11.

The lower-level sequencer 28 repeats the processes from step S802 to step S805 each time a packet designation by the packet list processing section 22 is received. Upon receiving a packet designation, the lower-level sequencer 28 acquires from the packet command sequence storage section 24 a command sequence for generating this packet, and sequentially executes the command sequence beginning with the leading command. For each command execution, the lower-level sequencer 28 performs the processes of steps S803 and S804 (S802, S805).

At step S803, the lower-level sequencer 28 outputs data corresponding to the command. At step S804, the lower-level sequencer 28 performs the computation or data conversion corresponding to the command. The lower-level sequencer 28 performs the processes of steps S803 and S804 in parallel.

When the final command is executed, the lower-level sequencer 28 returns the processing to the packet list processing section 22 and receives the next packet designation from the packet list processing section 22 (S805). When processing of the final packet in the packet sequence is finished, the packet list processing section 22 ends the process flow (S806).

As described above, the test apparatus 100 can cause each test block in a plurality of testing sections 20 to operate in synchronization. Furthermore, the test apparatus 100 can achieve synchronization multiple times during execution of a single test program.

The testing section 20 of the present embodiment can execute the packet list indicating a packet sequence and a command sequence in the packets, using separate sequencers. As a result, programs can be easily written for the testing section 20. Furthermore, the testing section 20 can commonly use command sequences and data for generated common packet types, and can therefore decrease the amount of information that must be stored.

The testing section 20 of the present embodiment individually designates an address of a command sequence executed by the lower-level sequencer 28 and an address of a data sequence read by the lower-level sequencer 28, from the packet list processing section 22. Therefore, the testing section 20 can generate different data sequences using the same command sequence. Accordingly, the testing section 20 need not store a plurality of the same command sequences, and can therefore decrease the amount of information that must be stored.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a plurality of testing sections that sequentially execute commands included in programs supplied respectively thereto so as to output data patterns to be provided to pins of the device under test; and
    a synchronizing section that synchronizes operation of at least two testing sections among the plurality of testing sections, wherein
    each testing section transmits a synchronization standby command to the synchronizing section when a predetermined condition is fulfilled during execution of the corresponding program and the testing section enters a synchronization standby state, and
    on a condition that the synchronization standby commands have been received from all of one or more designated testing sections among the plurality of testing sections, the synchronizing section supplies a synchronization signal, which ends the synchronization standby state, in synchronization to the at least two testing sections, the one or more designated testing sections being a different combination of testing sections than the at least two testing sections.

2. The test apparatus according to claim 1, wherein
the synchronizing section is further operable to supply the synchronization signal in synchronization to all of the testing sections on a condition that the synchronization standby commands have been received from all of the testing sections.

3. The test apparatus according to claim 1, wherein
after a predetermined time has passed since receiving a final one of the synchronization standby commands from the one or more designated testing sections, the synchronizing section supplies the synchronization signal in synchronization to the at least two testing sections.

4. The test apparatus according to claim 3, wherein
the predetermined time is a constant time that is unaffected by the number of the one or more designated testing sections.

5. The test apparatus according to claim 1, wherein
the synchronizing section changes a combination of the testing sections to which the synchronization signal is supplied in synchronization, during execution of the programs.

6. The test apparatus according to claim 1, wherein
each testing section transmits to the synchronizing section a designation command indicating whether the synchronization standby state of the testing section is to be ended when another testing section has entered the synchronization standby state prior to the synchronization standby command being sent to the synchronizing section, and
on a condition that the synchronization standby commands have been received from all of the one or more designated testing sections set by the designation commands, the synchronizing section supplies the synchronization signal to the corresponding testing sections.

7. The test apparatus according to claim 1, wherein
each program includes a command for repeatedly supplying the device under test with a predetermined wait packet when the corresponding testing section is in the synchronization standby state, and
each testing section transmits the synchronization standby command to the synchronizing section when a command for supplying the device under test with the wait packet is detected.

8. The test apparatus according to claim 1, wherein
the device under test includes a plurality of function blocks that operate at different frequencies,
the at least two testing sections include at least one testing section belonging to a first time domain of the test apparatus and at least one testing section belonging to a second time domain of the test apparatus, the first time domain and the second time domain being operable to test different function blocks of the device under test, and
the synchronization section includes an upper-level synchronizing function that supplies the synchronization signal in response to a notification that the synchronization standby commands have been received from the at least one testing section belonging to the first time domain and the at least one testing section belonging to the second time domain.

9. A test method comprising:

using a plurality of testing sections of a test apparatus to sequentially execute commands included in programs supplied respectively thereto so as to output data patterns to be provided to sins of a device under test;

using each testing section to transmit a synchronization standby command to a synchronizing section of the test apparatus when a predetermined condition is fulfilled during execution, by the testing section, of a program supplied to the testing section and the testing section enters a synchronization standby state; and on a condition that the synchronization standby commands have been received by the synchronizing section from all of one or more designated testing sections among the plurality of testing sections, supplying a synchronization signal, which ends the synchronization standby state, in synchronization to at least two testing sections among the plurality of testing sections to synchronize operation of the at least two testing sections, the one or more designated testing sections being a different combination of testing section than the at least two testing sections.

10. The test method according to claim 9, further comprising supplying the synchronization signal in synchronization to all of the testing sections on a condition that the synchronization standby commands have been received from all of the testing sections.

11. The test method according to claim 9, wherein the supplying includes supplying the synchronization signal in synchronization to the at least two testing sections after a predetermined time has passed since receiving a final one of the synchronization standby commands from the one or more designated testing sections.

12. The test method according to claim 11, wherein the predetermined time is a constant time that is unaffected by the number of the one or more designated testing sections.

13. The test method according to claim 9, further comprising changing a combination of the testing sections to which the synchronization signal is supplied in synchronization, during execution of the programs.

14. The test method according to claim 9, further comprising using each testing section to transmit, to the synchronizing section, a designation command indicating whether the synchronization standby state of the testing section is to be ended when another testing section has entered the synchronization standby state prior to the synchronization standby command being sent to the synchronizing section, wherein the supplying includes, on a condition that the synchronization standby commands have been received from all of the one or more designated testing sections set by the designation commands, supplying the synchronization signal to the corresponding testing sections.

15. The test method according to claim 9, wherein each program includes a command for repeatedly supplying the device under test with a predetermined wait packet when the corresponding testing section is in the synchronization standby state, and said using each testing section to transmit a synchronization standby command includes using each testing section to transmit the synchronization standby command to the synchronizing section when a command for supplying the device under test with the wait packet is detected.

16. The test method according to claim 9, wherein the device under test includes a plurality of function blocks that operate at different frequencies, the at least two testing sections include at least one testing section belonging to a first time domain of the test apparatus and at least one testing section belonging to a second time domain of the test apparatus, the first time domain and the second time domain being operable to test different function blocks of the device under test, and the supplying includes supplying, by an upper-level synchronizing function of the synchronizing section, the synchronization signal in response to a notification that the synchronization standby commands have been received from the at least one testing section belonging to the first time domain and the at least one testing section belonging to the second time domain.

* * * * *